(12) United States Patent
Cheng et al.

(10) Patent No.: US 10,497,796 B1
(45) Date of Patent: Dec. 3, 2019

(54) VERTICAL TRANSISTOR WITH REDUCED GATE LENGTH VARIATION

(71) Applicant: International Business Machines Corporation, Armonk, NY (US)

(72) Inventors: Kangguo Cheng, Schenectady, NY (US); Juntao Li, Cohoes, NY (US); Choonghyun Lee, Rensselaer, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/994,720

(22) Filed: May 31, 2018

(51) Int. Cl.
*H01L 29/66* (2006.01)
*H01L 21/02* (2006.01)
(Continued)

(52) U.S. Cl.
CPC .. *H01L 29/66666* (2013.01); *H01L 21/02532* (2013.01); *H01L 21/3081* (2013.01); *H01L 21/30604* (2013.01); *H01L 29/0847* (2013.01); *H01L 29/165* (2013.01); *H01L 29/6653* (2013.01); *H01L 29/7827* (2013.01)

(58) Field of Classification Search
CPC ......... H01L 29/66666; H01L 21/02532; H01L 21/30604; H01L 21/3081; H01L 29/0847; H01L 29/165; H01L 29/6623; H01L 29/7827
See application file for complete search history.

(56) References Cited

U.S. PATENT DOCUMENTS 9,412,666 B2  8/2016  Chen et al.
9,543,304 B2  1/2017  Liu et al.
(Continued)

FOREIGN PATENT DOCUMENTS

WO   WO2016204786 A1   12/2016

OTHER PUBLICATIONS

Horiguchi et al., "Patterning challenges in advanced device architectures: FinFETs to nanowires," Advanced Etch Technology for Nanopatterning V, vol. 9782, p. 978209 (Mar. 2016) (10 pages).
(Continued)

*Primary Examiner* — Zandra V Smith
*Assistant Examiner* — Andre C Stevenson
(74) *Attorney, Agent, or Firm* — Vazken Alexanian; Michael J. Chang, LLC

(57) ABSTRACT

Techniques for reducing gate length variation in VFET devices are provided. In one aspect, a method for forming a VFET device includes: forming a first and a second semiconductor layer as a stack on a substrate; patterning fins in the stack each of which extends completely through the second semiconductor layer and partway into the first semiconductor layer, and wherein portions of the second semiconductor layer in each of the fins include active fin channels; selectively thinning the active fin channels; forming sidewall spacers alongside the active fin channels; forming bottom source and drains at a base of the fins below the sidewall spacers; removing the sidewall spacers; forming bottom spacers on the bottom source and drains; forming gate stacks over the bottom spacers; forming top spacers on the gate stacks; and forming top source and drains on the top spacers. A VFET device is also provided.

18 Claims, 5 Drawing Sheets

(51) Int. Cl.
*H01L 29/08* (2006.01)
*H01L 21/308* (2006.01)
*H01L 29/78* (2006.01)
*H01L 29/165* (2006.01)
*H01L 21/306* (2006.01)

(56) References Cited

U.S. PATENT DOCUMENTS

| | | | |
|---|---|---|---|
| 9,780,197 B1 * | 10/2017 | Xie | H01L 29/66553 |
| 9,882,004 B2 | 1/2018 | Jung et al. | |
| 10,217,846 B1 * | 2/2019 | Xie | H01L 29/66787 |
| 2015/0097220 A1 | 4/2015 | Ponoth et al. | |
| 2017/0207338 A1 | 7/2017 | Chiu et al. | |

OTHER PUBLICATIONS

Fang et al., "SAQP Pitch walk metrology using single target metrology," Proc. of SPIE, vol. 10145 (Mar. 2017) (7 total pages).

* cited by examiner

VERTICAL TRANSISTOR WITH REDUCED GATE LENGTH VARIATION

FIELD OF THE INVENTION

The present invention relates to vertical field-effect transistor (VFET) devices, and more particularly, to techniques for reducing gate length variation in VTFET devices.

BACKGROUND OF THE INVENTION

As opposed to planar complementary metal-oxide-semiconductor (CMOS) devices, vertical field effect transistors (VFET) devices are oriented with a vertical fin channel disposed on a bottom source/drain and a top source/drain disposed on the fin channel. VFET devices are being pursued as a viable CMOS architecture to continue CMOS scaling.

Unwanted variations such as fin pitch walking can be introduced during fabrication of VFET devices. Fin pitch walking is undesirable as it results in variation in fin height which in turn results in variation in bottom spacer height and thus gate length variation.

Therefore, techniques which improve gate length uniformity in VTFET devices would be desirable.

SUMMARY OF THE INVENTION

The present invention provides techniques for reducing gate length variation in vertical field-effect transistor (VFET) devices. In one aspect of the invention, a method for forming a VFET device is provided. The method includes: forming a first semiconductor layer and a second semiconductor layer as a stack on a substrate; patterning fins in the stack, wherein each of the fins extends completely through the second semiconductor layer and partway into the first semiconductor layer, and wherein portions of the second semiconductor layer in each of the fins include active fin channels; selectively thinning the active fin channels to form a staircase structure at an interface between the active fin channels and the first semiconductor layer; forming sidewall spacers alongside the active fin channels; forming bottom source and drains at a base of the fins below the sidewall spacers such that tops of the source and drains are flush with bottoms of the active fin channels; removing the sidewall spacers; forming bottom spacers on the bottom source and drains; forming gate stacks over the bottom spacers surrounding the active fin channels; forming top spacers on the gate stacks; and forming top source and drains on the top spacers.

In another aspect of the invention, a VFET device is provided. The VFET device includes: a first semiconductor layer and a second semiconductor layer disposed as a stack on a substrate; fins patterned in the stack having differing fin heights, wherein each of the fins extends completely through the second semiconductor layer and partway into the first semiconductor layer, and wherein portions of the second semiconductor layer in each of the fins include active fin channels having a uniform fin height; bottom source and drains at a base of the fins, wherein tops of the source and drains are flush with bottoms of the active fin channels; bottom spacers on the bottom source and drains; gate stacks over the bottom spacers surrounding the active fin channels; top spacers on the gate stacks; and top source and drains on the top spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for vertical field effect transistors (VFET) device fabrication where gate length uniformity is achieved by patterning the fin channels in a stack of layers, whereby height variations in the patterned fins (e.g., due to fin pitch walking) are absorbed by the lower layer in the stack, with the active fin patterned in the upper layer of the stack being a uniform height across all of the fins. To allow selective processing of the active fin, the active fin is laterally trimmed to create a staircase at the interface between the active fin and the lower layer. This staircase structure permits spacers to be selectively formed along sidewalls of only the active fin, with the spacers being self-aligned to the bottom of the active fins. Accordingly, the gate length (Lgate) and bottom source and drain junction are immune to fin height variation.

Figure 1:
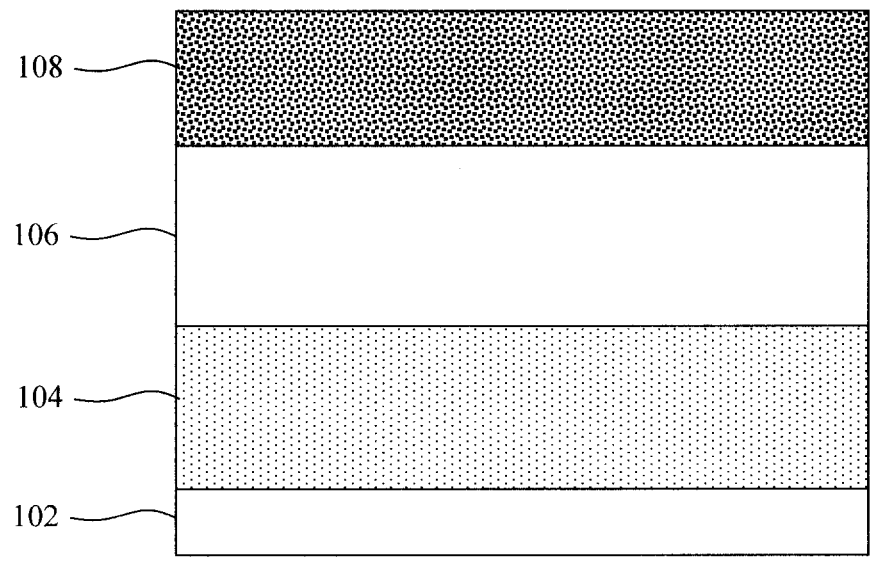
FIG. 1 is a cross-sectional diagram illustrating a first semiconductor layer and a second semiconductor layer having been formed as a stack on a substrate, and a hardmask layer having been deposited onto the stack according to an embodiment of the present invention.

An exemplary methodology for forming a VFET device is now described by way of reference to FIGS. 1-10. As shown in FIG. 1, the process begins with a substrate 102. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

As highlighted above, a stack of semiconductor layers is then formed on the substrate 102, the stack including at least a (first) bottom layer 104 and a (second) top layer 106. The bottom layer 104 will serve as a 'sacrificial' layer for absorbing height variations in the fins that will be patterned in the stack whereas the top layer 106, when patterned, will form the active fin channels of the VFET device. According to an exemplary embodiment, both bottom layer 104 and top layer 106 are epitaxial semiconductor layers grown on the substrate 102. As will be described in detail below, a lateral etch of the active fin channels (selective to the bottom layer 104) will be performed to create a unique staircase structure at the interface between the active fin channels and the bottom layer 104. Thus, generally, the selection of materials for bottom layer 104 and top layer 106 should be such that good etch selectivity between the two layers is achievable. By way of example only, materials providing such etch selectivity include, but are not limited to, Si and SiGe. For instance, Si would be used for one of the bottom layer 104 and top layer 106, and SiGe for the other. In that case, the specific combination employed would depend on which material (i.e., Si or SiGe) is desired for use as the active fin channel. According to an exemplary embodiment, the bottom layer 104 has a thickness of from about 10 nanometers (nm) to about 50 nm and ranges therebetween, and the top layer 106 has a thickness of from about 20 nm to about 60 nm and ranges therebetween.

As shown in FIG. 1, a hardmask layer 108 is then deposited onto the stack, i.e., onto top layer 106. Hardmask layer 108 will serve as the basis for forming individual fin hardmasks. As will be described in detail below, spacers will be formed along sidewalls of the active fin channels, which involves globally depositing a spacer and then etching back the spacer to leave only those portions alongside the (thinned) active fin channels below the fin hardmasks. Thus, the hardmask layer 108 needs to be formed from a material that provides etch selectivity to the spacers. For instance, according to an exemplary embodiment, the hardmask layer 108 is formed from an oxide hardmask material such as silicon oxycarbide (SiCO), while the spacers are formed from a nitride dielectric such as silicon nitride (SiN) and/or silicon oxynitride (SiON), or vice versa.

Figure 2:
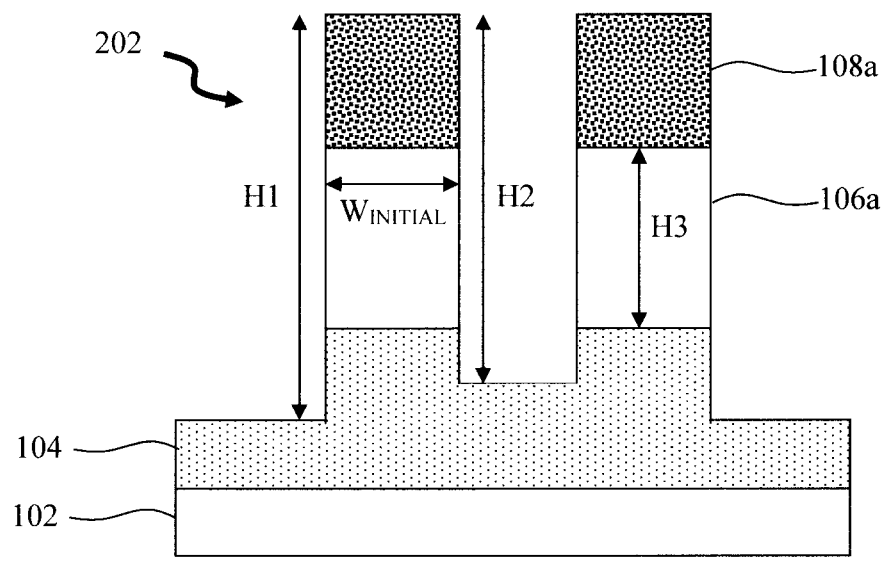
FIG. 2 is a cross-sectional diagram illustrating the hardmask layer having been patterned into a plurality of individual fin hardmasks, and the fin hardmasks having been used to pattern fins in the stack each of which extends into the (bottom) first semiconductor layer, wherein a portion of the fins patterned in the (top) second semiconductor layer form active fin channels according to an embodiment of the present invention.

As shown in FIG. 2, the hardmask layer 108 is then patterned into a plurality of individual fin hardmasks 108a which mark the footprint and location of fins 202 that are patterned in the stack. Any suitable lithography and etching technique may be used to pattern the hardmask layer 108. For instance, direct patterning or sidewall image transfer (SIT) process may be employed. Advantageously, SIT (also referred to as self-aligned double patterning (SADP)) can be used to pattern fins at a sub-lithographic pitch, i.e., a pitch smaller than what is achievable using direct lithographic patterning. A process wherein the SIT steps are repeated is referred to as self-aligned quadruple patterning (SAQP). The SAQP process is described, for example, in Fang et al., "SAQP Pitch walk metrology using single target metrology," Proc. of SPIE, vol. 10145 (March 2017) (7 total pages), the contents of which are incorporated by reference as if fully set forth herein.

The fin hardmasks 108a are then used to pattern fins 202 in the stack. Specifically, as shown in FIG. 2, each of the fins 202 as patterned extend completely through top layer 106 and partway into bottom layer 104. The portion of the fins 202 patterned in the top layer 106 forms the active fin channels 106a. By way of example only, a directional (anisotropic) etching process such reactive ion etching (RIE) may be employed for the fin etch.

It is important that each of the fins 202 extends into the bottom layer 104. That way, any variation in the heights of the patterned fins 202 (e.g., due to fin pitch walking) can be absorbed by the bottom layer 104. For instance, for illustrative purposes only, FIG. 2 depicts the fins 202 having different heights, i.e., H1 and H2, wherein H1>H2, on opposite sides of the same fin. However, since the fins 202 each extend into the bottom layer 104, the height H3 of the active fin channels 106a is uniform across all of the fins 202.

Another notable feature from FIG. 2 is that the fins 202 are patterned to intentionally have an initial fin width ($W_{INITIAL}$) greater than the final fin width ($W_{FINAL}$—see below). According to an exemplary embodiment, $W_{INITIAL}$ is from about 10 nm to about 20 nm and ranges therebetween. Namely, a lateral trimming of the active fin channels 106a will later be performed which will create a unique staircase structure that will enable the selective placement of sidewall spacers alongside only the active fin channels.

Figure 3:
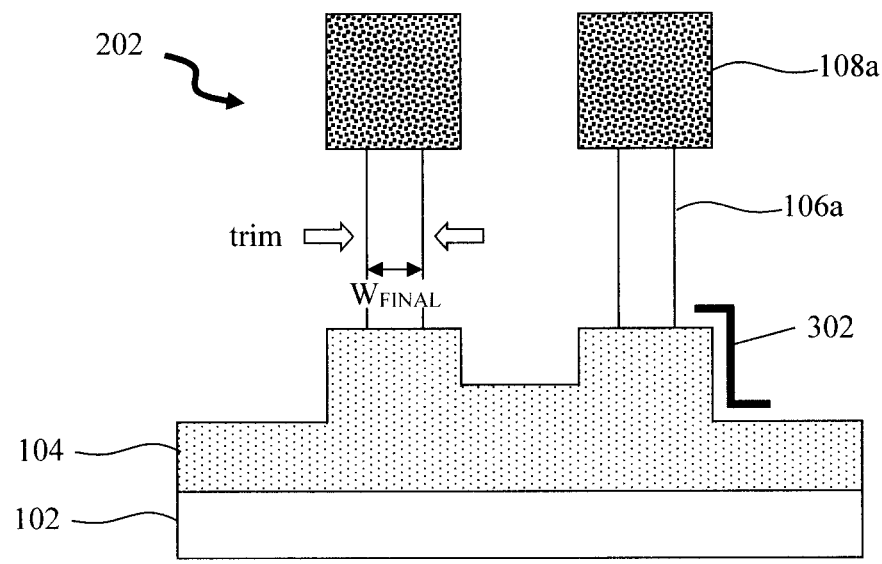
FIG. 3 is a cross-sectional diagram illustrating the active fin channels having been thinned according to an embodiment of the present invention.
Figure 4:
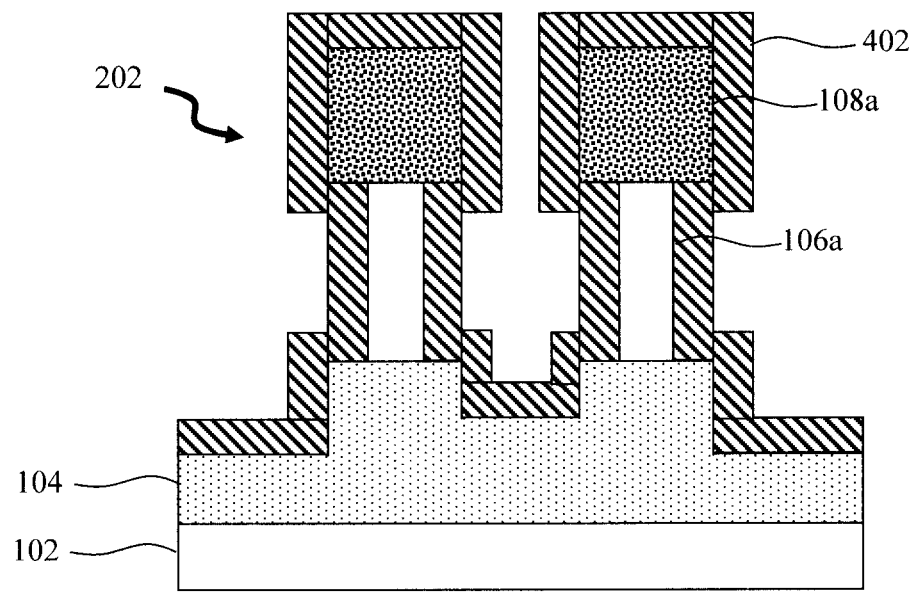
FIG. 4 is a cross-sectional diagram illustrating a dielectric spacer material having been deposited over the fins according to an embodiment of the present invention.
Figure 5:
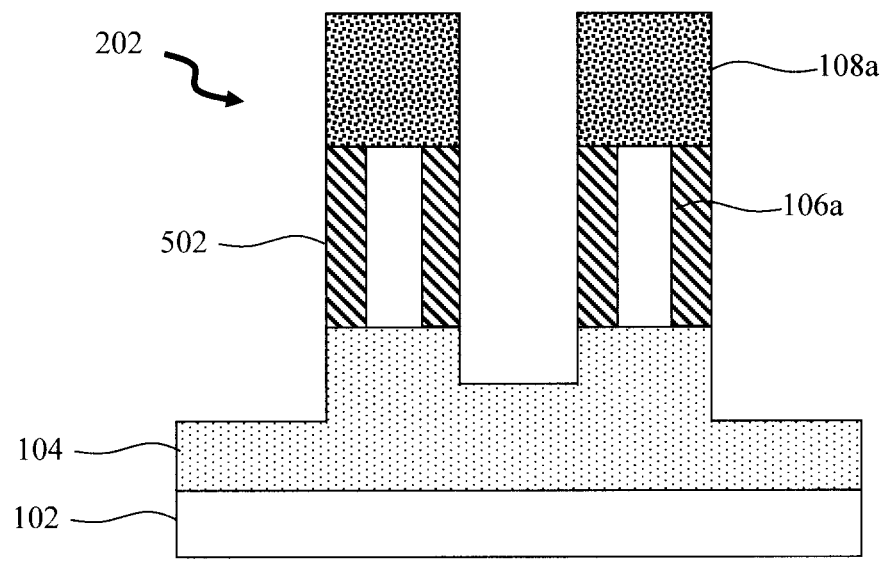
FIG. 5 is a cross-sectional diagram illustrating the spacer material having been removed from all but the sidewalls of the active fin channels, forming sidewall spacers according to an embodiment of the present invention.
Figure 6:
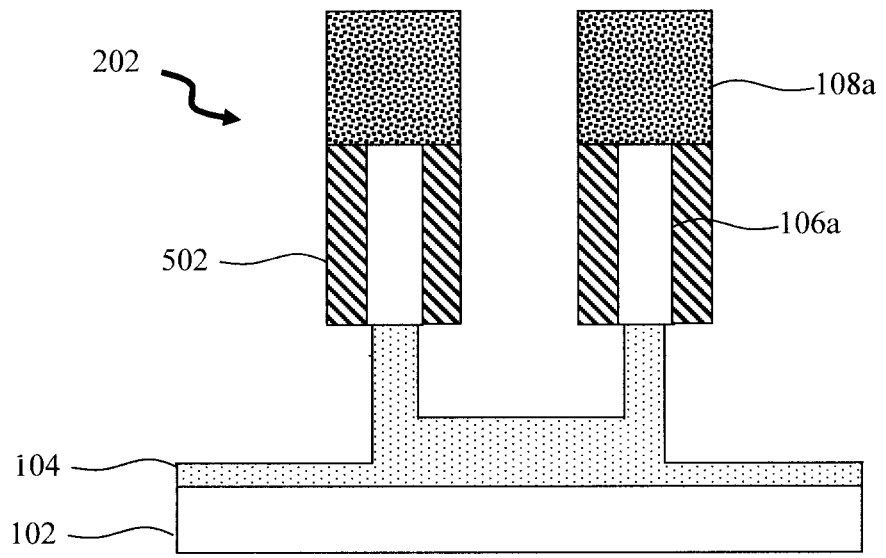
FIG. 6 is a cross-sectional diagram illustrating an optional recess etch of the (bottom) first semiconductor layer having been performed to open up space beneath the active fin channels for bottom source and drains according to an embodiment of the present invention.

Namely, as shown in FIG. 3, a lateral etch is next performed to trim the active fin channels 106a selective to the fin hardmasks 108a and the bottom layer 104. A non-directional (isotropic) etching process can be used for the fin trimming. For instance, by way of example only, when the active fin channels are formed from Si, a wet etch with ammonium hydroxide ($NH_4OH$), tetraethylammonium hydroxide (TEAH) and/or tetraethylammonium hydroxide (TMAH) can be employed to selectively trim the active fin channels 106a. Other suitable etching techniques such as plasma etch or gas phase etch can also be used. Conversely, when the active fin channels are formed from SiGe, a wet etch with wet hot SC1, vapor phase hydrogen chloride (HCl) and/or vapor phase chlorine trifluoride ($ClF_3$) can be employed to selectively trim the active fin channels 106a.

As provided above, the as-patterned fins 202 are intentionally made wider than a desired final fin width ($W_{FINAL}$), i.e., $W_{INITIAL}>W_{FINAL}$ (compare FIG. 2 and FIG. 3) to enable this selective trimming of the active fin channels 106a which, as shown in FIG. 3, creates a staircase structure 302 with respect to the bottom layer 104. According to an exemplary embodiment, $W_{FINAL}$ is from about 4 nm to about 12 nm and ranges therebetween. This staircase structure 302 will enable the selective placement of spacers along the sidewalls of the active fin channels 106a. To do so, a dielectric spacer material 402 is first deposited (globally) over the fins 202 and bottom layer 104, including alongside the (trimmed) active fin channels 106a. See FIG. 4. Suitable dielectric spacer materials include, but are not limited to, nitride materials such as SiN and/or SiON. A conformal deposition process such as chemical vapor deposition (CVD) or atomic layer deposition (ALD) can be employed for depositing the dielectric spacer material 402, e.g., to a thickness of from about 5 nanometers (nm) to about 20 nm, and ranges therebetween.

A directional etching process such as RIE is then used to remove the spacer material 402 from all but the sidewalls of the (trimmed) active fin channels 106a, forming (sidewall) spacers 502. See FIG. 5. Notably, the overhang of fin hardmasks 108a protects the spacers 502 along the sidewalls of the (trimmed) active fin channels 106a during this directional spacer etch. Further, the unique staircase structure at the interface between the active fin channels 106a and the bottom layer 104 permits the selective removal of spacers material 402 below the active fin channels 106a. As a result, all that remains are spacers 502 along the sidewalls of the active fin channels 106a.

With the spacers 502 in place to protect the active fin channels 106a, an optional recess etch of the bottom layer 104 can be performed to open up space beneath the active fin channels 106a for the bottom source and drains. See FIG. 6. A non-directional (isotropic) etching process such as a wet etch can be used to recess the bottom layer 104. For instance, by way of example only, when the bottom layer 104 is formed from Si, a wet etch with $NH_4OH$, TEAH and/or TMAH can be employed to recess the bottom layer 104. Conversely, when the bottom layer 104 is formed from SiGe, a wet etch with wet hot SC1, vapor phase HCl and/or vapor phase $ClF_3$ can be employed to recess the bottom layer 104.

Bottom source and drains 702 are then formed at the base of the fins 202. See FIG. 7. According to an exemplary embodiment, the bottom source and drains 702 are formed from an in-situ doped (e.g., during growth) or ex-situ doped (e.g., by ion implantation) epitaxial material. By way of example only, suitable source and drain materials for a p-channel VFET (pFET) include, but are not limited to, boron-doped SiGe (SiGe:B). Suitable source and drain materials for an n-channel VFET (nFET) include, but are not limited to, phosphorous-doped Si (Si:P).

Figure 7:
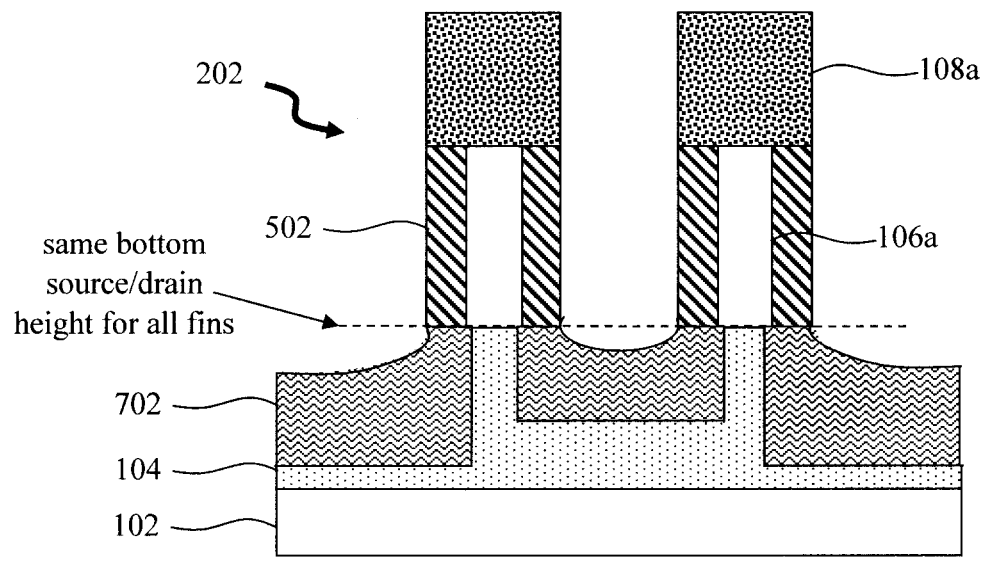
FIG. 7 is a cross-sectional diagram illustrating bottom source and drains having been formed at the base of the fins according to an embodiment of the present invention.

As shown in FIG. 7, epitaxial bottom source and drains 702 formed in this manner can have a contoured surface topography (i.e., a non-flat surface) since growth will occur from both the horizontal and vertical surfaces of the bottom layer 104. Notwithstanding, the growth is pinned below the active fin channels 106a by the spacers 502. Thus, the bottom source and drains 702 will be at the same height for all of the fins 202, i.e., the bottom source and drains 702 will be flush with the bottom of the active fin channels 106a (despite the starting heights of the fins 202 being different due to fin pitch walking). See FIG. 7. Further, it is notable that the resulting structure uniquely includes a portion of the bottom layer 104 remaining beneath the bottom source and drains 702.

Figure 8:
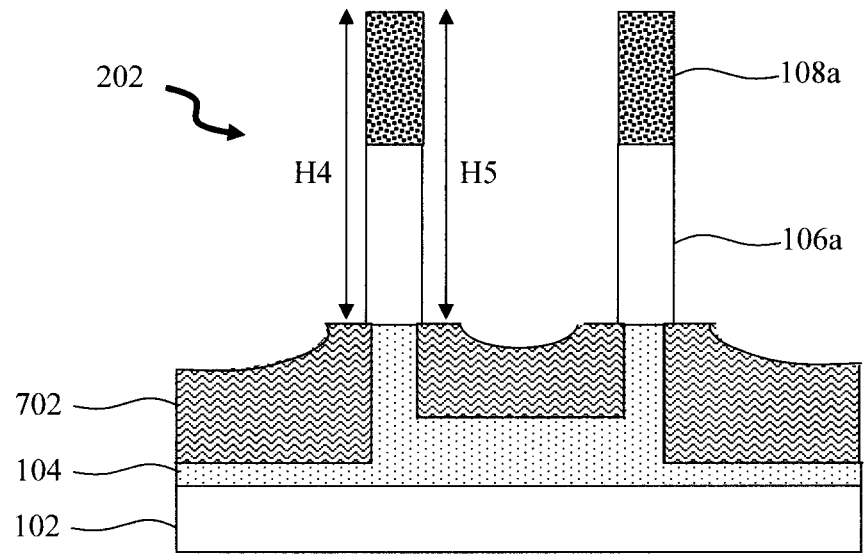
FIG. 8 is a cross-sectional diagram illustrating the fin hardmasks having been trimmed and the sidewall spacers having been removed according to an embodiment of the present invention.

As shown in FIG. 8, the fin hardmasks 108a are trimmed and the spacers 502 are removed. This will permit formation of gates alongside the active fin channels 106a. After removal of the spacers 502, it is clearly evident that the upper surfaces of the bottom source and drains 702 are flush (i.e., aligned) with the bottom of the active fin channels 106a. Thus, above the bottom source and drains 702, the fins 202 have a uniform height even when the starting fin height varied due to fin pitch walking. See, for example, FIG. 8 where height H4 and height H5 on the left and right sides of the fins 202 are uniform, i.e., H4=H5.

Bottom spacers 902 are then formed on the bottom source and drains 702. Suitable materials for the bottom spacers 902 include, but are not limited to, oxide spacer materials such as $SiO_2$ and/or SiOC and/or nitride spacer materials such as SiN and/or silicon-boron-nitride (SiBN).

According to an exemplary embodiment, the bottom spacers 902 are formed using a directional deposition process whereby the spacer material is deposited onto the bottom source and drains 702 and fins 202 with a greater amount of the material being deposited on horizontal surfaces (including on top of the bottom source and drains 702 in between the fins 202), as compared to vertical surfaces (such as alongside the fins 202). Thus, when an etch is used on the spacer material, the timing of the etch needed to remove the spacer material from the vertical surfaces will leave the bottom spacers 902 shown in FIG. 9 on the bottom source and drains 702 since a greater amount of the spacer material was deposited on the bottom source and drains 702. By way of example only, a high density plasma (HDP) CVD or physical vapor deposition (PVD) process can be used for directional film deposition, and an oxide- or nitride-selective (depending on the spacer material) isotropic etch can be used to remove the (thinner) spacer material deposited onto the vertical surfaces.

Next, gate stacks (i.e., a gate dielectric and a gate conductor) are formed over the bottom spacers 902 surrounding each of the active fin channels 106a. To form the gate stacks, an interfacial oxide 904 is first formed selectively on exposed surfaces of the active fin channels 106a by an oxidation process to a thickness for example of from about 0.3 nanometers (nm) to about 5 nm, and ranges therebetween, e.g., about 1 nm. A gate dielectric 906 is then deposited onto the active fin channels 106a over the interfacial oxide 904 and over the bottom spacers 902 using a conformal deposition process such as CVD or ALD. A gate conductor 908 is deposited onto the gate dielectric 906 using a process such as CVD, ALD, electrochemical plating, etc. See FIG. 9.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (Nisi)), transition metal aluminides (e.g. $Ti_3Al$, ZrAl), TaC, TaMgC, carbon nanotubes, conductive carbon, graphene, or any combinations thereof. The gate conductor can further include dopants that are incorporated during or after deposition. In some embodiments, the gate may further comprise a workfunction setting layer between the gate dielectric and gate conductor. The workfunction setting layer can be a workfunction metal. The workfunction metal can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal. The gate conductor and workfunction metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Suitable gate dielectrics include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide (HfO$_2$) rather than 3.9 for SiO$_2$). Suitable high-κ materials include, but are not limited to, metal oxides such as hafnium oxide (HfO$_2$), hafnium silicon oxide (HfSiO), hafnium silicon oxynitride (HfSiO), lanthanum oxide (La$_2$O$_3$), lanthanum aluminum oxide (LaAlO$_3$), zirconium oxide (ZrO$_2$), zirconium silicon oxide (ZrSiO$_4$), zirconium silicon oxynitride (ZrSiOxNy), tantalum oxide (TaOx), titanium oxide (TiO), barium strontium titanium oxide (BaO$_6$SrTi$_2$), barium titanium oxide (BaTiO$_3$), strontium titanium oxide (SrTiO$_3$), yttrium oxide (Y$_2$O$_3$), aluminum oxide (Al$_2$O$_3$), lead scandium tantalum oxide (Pb(Sc,Ta)O$_3$), and/or lead zinc niobite (Pb(Zn,Nb)O). The high-κ can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, the gate dielectric 906 has a thickness of from about 1 nm to about 5 nm and ranges therebetween, although less thicknesses and greater thicknesses are also conceived.

A notable feature of the present VFET device design is that the contoured surface topography of the bottom source and drains 702 (see above) carries through to the overlying gate stacks. Advantageously, this non-flat configuration serves to increase the area and overall volume of the gate stacks. An increased gate stack area beneficially lowers the gate resistance.

Figure 9:
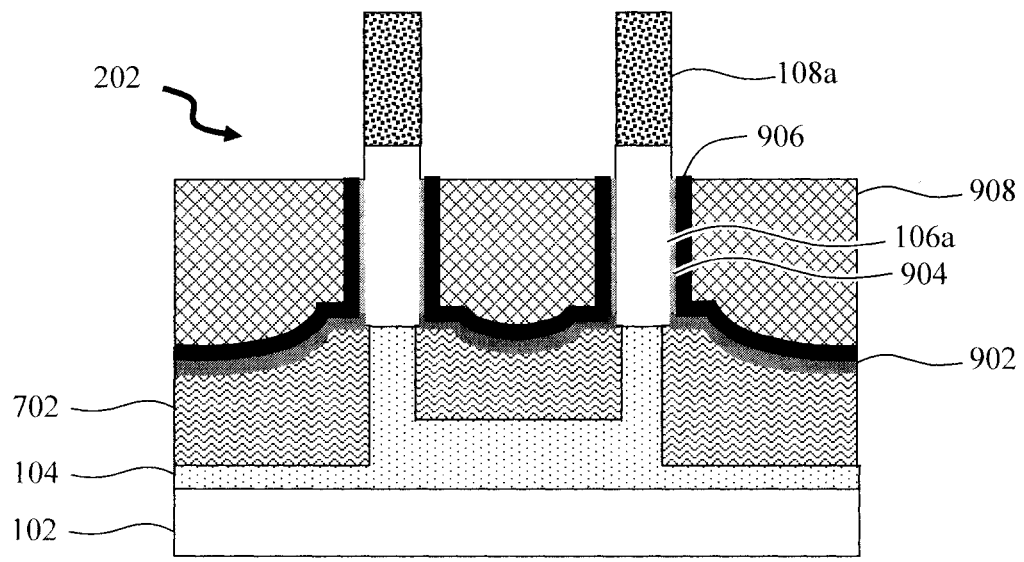
FIG. 9 is a cross-sectional diagram illustrating bottom spacers having been formed on the bottom source and drains, and gate stacks having been formed over the bottom spacers surrounding each of the active fin channels according to an embodiment of the present invention.

As shown in FIG. 9, following deposition of the gate stack materials, the gate stacks are recessed to expose the tops of the fins 202. This enables placement of the top spacers and formation of the top source and drains.

Figure 10:
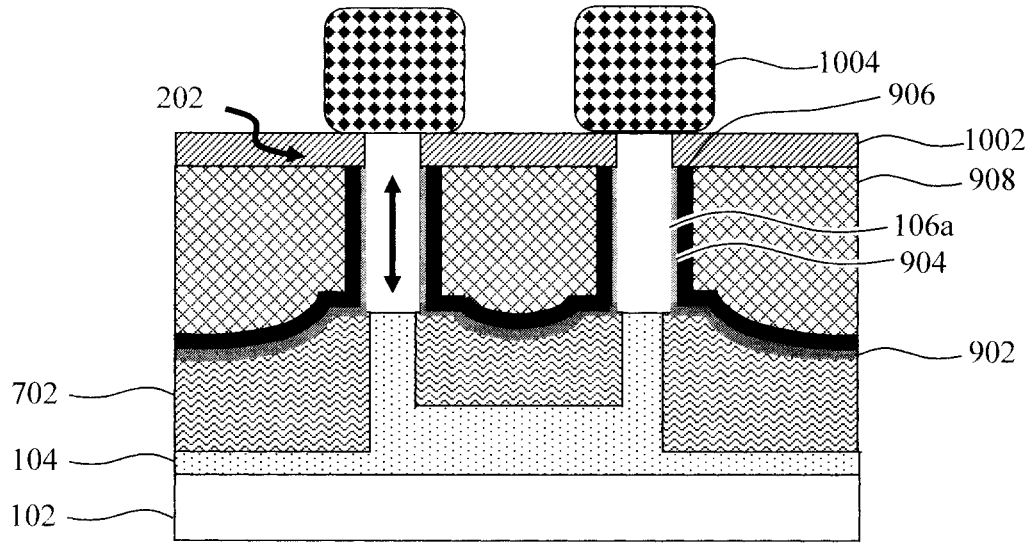
FIG. 10 is a cross-sectional diagram illustrating top spacers having been formed on the gate stacks, and top source and drains having been formed over the top spacers at the tops of the fins according to an embodiment of the present invention.

Specifically, as shown in FIG. 10, top spacers 1002 are formed on the gate stacks (using, e.g., a directional deposition process—see above). Suitable materials for the top spacers 1002 include, but are not limited to, oxide spacer materials such as SiO$_2$ and/or SiOC and/or nitride spacer materials such as SiN and/or SiBN. The fin hardmasks 108a are then removed. The fin hardmasks 108a can be removed using an oxide-selective etching process such as an oxide-selective RIE.

Top source and drains 1004 are then formed over the top spacers 1002 at the tops of the fins 202. According to an exemplary embodiment, the top source and drains 1004 are formed from an in-situ doped (e.g., during growth) or ex-situ doped (e.g., by ion implantation) epitaxial material. As provided above, suitable source and drain materials for a pFET include, but are not limited to, SiGe:B and suitable source and drain materials for an nFET include, but are not limited to, Si:P.

As shown in FIG. 10, all gate stack abuts the bottom of the active fin channels 106a at the same height. Thus, with the present techniques, the gate length (Lgate) is immune to the effects of fin pitch walking. Further, as provided above, even with the contoured surface topography of the bottom source and drains 702, the bottom source and drains 702 abutting the active fin channels 106a are all at the same height.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a vertical field-effect transistor (VFET) device, comprising the steps of:
   forming a first semiconductor layer and a second semiconductor layer as a stack on a substrate;
   patterning fins in the stack, wherein each of the fins extends completely through the second semiconductor layer and partway into the first semiconductor layer, and wherein portions of the second semiconductor layer in each of the fins comprise active fin channels;
   selectively thinning the active fin channels to form a staircase structure at an interface between the active fin channels and the first semiconductor layer;
   forming sidewall spacers alongside the active fin channels;
   forming bottom source and drains at a base of the fins below the sidewall spacers such that tops of the bottom source and drains are flush with bottoms of the active fin channels, wherein the bottom source and drains have a contoured surface topography;
   removing the sidewall spacers;
   forming bottom spacers on the bottom source and drains;
   forming gate stacks over the bottom spacers surrounding the active fin channels;
   forming top spacers on the gate stacks; and
   forming top source and drains on the top spacers.

2. The method of claim 1, wherein the first semiconductor layer is formed having a thickness of from about 10 nm to about 50 nm and ranges therebetween, and wherein the second semiconductor layer is formed having a thickness of from about 20 nm to about 60 nm and ranges therebetween.

3. The method of claim 1, wherein the first semiconductor layer comprises silicon germanium (SiGe) and the second semiconductor layer comprises silicon (Si).

4. The method of claim 3, further comprising the steps of:
   growing epitaxial SiGe on the substrate as the first semiconductor layer; and
   growing epitaxial Si on the epitaxial SiGe as the second semiconductor layer.

5. The method of claim 1, further comprising the steps of:
   depositing a hardmask layer onto the second semiconductor layer;
   patterning the hardmask layer into individual fin hardmasks; and
   using the individual fin hardmasks to pattern the fins in the stack.

6. The method of claim 5, wherein the active fin channels are selectively thinned to a final width ($W_{FINAL}$), the method further comprising the step of:
   patterning the fins in the stack at an initial width ($W_{INITIAL}$), wherein $W_{INITIAL} > W_{FINAL}$.

7. The method of claim 6, further comprising the step of:
   thinning the individual fin hardmasks prior to removing the sidewall spacers.

8. The method of claim 5, wherein the hardmask layer comprises silicon oxycarbide (SiCO).

9. The method of claim 1, further comprising the steps of:
depositing a spacer material over the fins; and
removing the spacer material from all but alongside the active fin channels to form the sidewall spacers.

10. The method of claim 9, wherein the spacer material comprises a dielectric spacer material selected from the group consisting of: silicon nitride (SiN), silicon oxynitride (SiON), and combinations thereof.

11. The method of claim 1, further comprising the step of:
recessing the first semiconductor layer after the sidewall spacers are selectively formed alongside the active fin channels and prior to forming the bottom source and drains at a base of the fins.

12. The method of claim 1, wherein the gate stacks comprise:
a gate dielectric on the active fin channels; and
a gate conductor on the gate dielectric.

13. The method of claim 1, wherein a portion of the first semiconductor layer remains present beneath the bottom source and drains.

14. The method of claim 1, wherein the top source and drains and the bottom source and drains each comprise a material selected from the group consisting of: phosphorous-doped Si (Si:P) and boron-doped SiGe (SiGe:B).

15. A VFET device, comprising:
a first semiconductor layer and a second semiconductor layer disposed as a stack on a substrate;
fins patterned in the stack having differing fin heights, wherein each of the fins extends completely through the second semiconductor layer and partway into the first semiconductor layer, and wherein portions of the second semiconductor layer in each of the fins comprise active fin channels having a uniform fin height;
bottom source and drains at a base of the fins, wherein tops of the bottom source and drains are flush with bottoms of the active fin channels, and wherein the bottom source and drains have a contoured surface topography;
bottom spacers on the bottom source and drains;
gate stacks over the bottom spacers surrounding the active fin channels;
top spacers on the gate stacks; and
top source and drains on the top spacers.

16. The VFET device of claim 15, wherein a portion of the first semiconductor layer is present beneath the bottom source and drains.

17. The VFET device of claim 15, wherein the first semiconductor layer comprises SiGe and the second semiconductor layer comprises Si.

18. The VFET device of claim 15, wherein the gate stacks comprise:
a gate dielectric on the active fin channels; and
a gate conductor on the gate dielectric.

\* \* \* \* \*